(12) United States Patent
Zhou

(10) Patent No.: US 11,404,450 B2
(45) Date of Patent: Aug. 2, 2022

(54) ARRAY SUBSTRATE AND DISPLAY PANEL

(71) Applicant: Shenzhen China Star Optoelectronics Semiconductor Display Technology Co., Ltd., Shenzhen (CN)

(72) Inventor: Shuai Zhou, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/622,918

(22) PCT Filed: Nov. 4, 2019

(86) PCT No.: PCT/CN2019/115234
§ 371 (c)(1),
(2) Date: Dec. 16, 2019

(87) PCT Pub. No.: WO2021/042485
PCT Pub. Date: Mar. 11, 2021

(65) Prior Publication Data
US 2022/0190001 A1  Jun. 16, 2022

(30) Foreign Application Priority Data
Sep. 6, 2019 (CN) .......................... 201910843718.X

(51) Int. Cl.
*H01L 27/12* (2006.01)
(52) U.S. Cl.
CPC ................. *H01L 27/1244* (2013.01)
(58) Field of Classification Search
None
See application file for complete search history.

(56) References Cited

U.S. PATENT DOCUMENTS

| 9,356,098 B2 | 5/2016 | Yamazaki |
| 10,290,665 B2 | 5/2019 | Zhou |
| 10,475,823 B2 | 11/2019 | Shi |
| 2011/0024755 A1* | 2/2011 | Korenari .......... H01L 29/78696 257/E29.288 |

(Continued)

FOREIGN PATENT DOCUMENTS

| CN | 101013725 A | 8/2007 |
| CN | 202159215 U | 3/2012 |

(Continued)

OTHER PUBLICATIONS

Yang et al., "Dual-Gate a-IGZO TFTs for Gate Driver Application", 2021 IEEE 4th International Conference on Electronics Technology (ICET) (pp. 45-49) (Year: 2021).*

*Primary Examiner* — Sitaramarao S Yechuri
(74) *Attorney, Agent, or Firm* — Nathan & Associates; Menachem Nathan

(57) ABSTRACT

The present application discloses an array substrate and a display panel, the array substrate including a substrate, and a first gate layer and a second gate layer formed on the substrate; the first gate layer includes a first gate line connecting a plurality of first gates, at least two of the second gates of the second gate layer connected to a same one of the first gates; or the second gate layer including a second gate line connecting the plurality of second gates, at least two of the first gates of the first gate layer connected to a same one of the second gates.

18 Claims, 2 Drawing Sheets

(56) References Cited

U.S. PATENT DOCUMENTS

| | | | |
|---|---|---|---|
| 2011/0057190 A1* | 3/2011 | Kimura | H01L 29/7869 |
| | | | 257/E27.06 |
| 2015/0102343 A1 | 4/2015 | Park et al. | |
| 2017/0207346 A1* | 7/2017 | Kong | H01L 29/78648 |
| 2017/0213916 A1* | 7/2017 | Niu | H01L 29/66969 |
| 2019/0074382 A1 | 3/2019 | Yamazaki et al. | |
| 2019/0081082 A1 | 3/2019 | Kimura | |
| 2019/0229217 A1 | 7/2019 | Kimura et al. | |
| 2019/0250451 A1* | 8/2019 | Xu | H01L 27/124 |

FOREIGN PATENT DOCUMENTS

| | | | | |
|---|---|---|---|---|
| CN | 104091834 A | | 10/2014 | |
| CN | 104716091 A | * | 6/2015 | H01L 21/77 |
| CN | 104966696 A | | 10/2015 | |
| CN | 105137673 A | | 12/2015 | |
| CN | 106684155 A | | 5/2017 | |
| CN | 106910748 A | | 6/2017 | |
| CN | 108475698 A | | 8/2018 | |
| CN | 108511457 A | | 9/2018 | |

* cited by examiner

ARRAY SUBSTRATE AND DISPLAY PANEL

BACKGROUND OF INVENTION

Field of Invention

The present invention relates to a field of display technologies, and in particular, to an array substrate and a display panel.

Description of Prior Art

With the development of the display technology, a flat display device such as a liquid crystal display (LCD) or an organic light emitting display (OLED) has advantages such as high image quality, power saving, and thin body, so it is widely used in various electronic products such as mobile phones and televisions. As a switching component and a driving component, a thin film transistor is generally applied to various display devices, wherein a top gate and a bottom gate may be respectively disposed on both sides of an active layer to form a double gate structure, and the active layer is driven by the double gate, which can effectively improve the carrier mobility and maintain the stability of the thin film transistor.

In the prior art, when the thin film transistor of an array substrate adopts a double gate structure, the storage capacitance of the sub-pixel is decreased, and the capacitance of the gate line is increased, thereby impacting the display effect of the display device.

SUMMARY OF INVENTION

The present invention provides an array substrate and a display panel, which aim to improve a structure of the array substrate, such that a carrier mobility of the thin film transistor of the array substrate is improved, a storage capacitance of the sub-pixels is increased, and a capacitance of the gate lines is reduced, thereby improving a display effect of a display device.

The present application provides an array substrate, including:

a substrate;

a first gate layer formed on the substrate, and the first gate layer including a first connection line and a plurality of first gates, the first connection line connecting the plurality of first gates together to form a first gate group;

a first insulating layer, an active layer, a source/drain layer, and a second insulating layer, sequentially formed over the first gate layer;

a second gate layer formed on the second insulating layer, and the second gate layer including a plurality of second gates and a second gate lines connecting the plurality of second gates;

a third insulating layer formed on the second gate layer; and a metal adapter layer formed on the third insulating layer, one side of the metal adapter layer passing through the third insulating layer and in contact with the second gate layer, while another side of the metal adapter layer passing through the third insulating layer, the second insulating layer, and the first insulating layer, and in contact with the plurality of first gates in the first gate group to connect the plurality of first gates in the first gate group to a same one of the plurality of second gates.

In some embodiments, the first connection line at least partially coincides with the second gate line.

The present application also provides an array substrate, including:

a substrate;

a first gate layer formed on the substrate, and the first gate layer including a plurality of first gates;

a first insulating layer, an active layer, a source/drain layer, and a second insulating layer, sequentially formed over the first gate layer; and a second gate layer formed on the second insulating layer, and the second gate layer including a plurality of second gates, wherein the first gate layer further includes a plurality of first gate lines connecting the plurality of first gates, and at least two of the plurality of second gate are connected to a same one of the plurality of first gates; or the second gate layer further includes a plurality of second gate lines connecting the plurality of second gates, and the at least two of the plurality of first gates are connected to a same one of the plurality of second gates.

In some embodiments, the first gate layer includes a first connection line connecting the plurality of first gates together to form a first gate group, one of the first gates in the first gate group connected to one of the second gates to connect the plurality of first gates to the same one of the plurality of second gates.

In some embodiments, the first connection line at least partially coincides with the second gate line.

In some embodiments, the source/drain layer includes a plurality of data lines, the second gate layer includes a plurality of second gate lines, and the plurality of data lines and the plurality of second gate lines intersect with each other to form a plurality of first pixel units, wherein the first gates of a plurality of sub-pixels in one of the first pixel units are all connected to the second gate of a same one of the sub-pixels.

In some embodiments, the second gate layer includes a second connection line, the second connection line is connected to the plurality of second gates together to form a second gate group, one of the second gates of the second gate group is connected to one of the first gates to connect the plurality of second gates to the same one of the plurality of first gates.

In some embodiments, the second connection line at least partially coincides with the first gate line.

In some embodiments, the source/drain layer includes a plurality of data lines, the first gate layer includes a plurality of first gate lines, and the plurality of data lines and the plurality of first gate lines intersect with each other to form a plurality of second pixel units, wherein the second gates of a plurality of sub-pixels in one of the second pixel units are all connected to the first gate of a same one of the sub-pixels.

In some embodiments, the array substrate further includes a third insulating layer formed on the second gate layer; and a metal adapter layer formed on the third insulating layer, wherein one side of the metal adapter layer passes through the third insulating layer and is in contact with the second gate layer, while another side of the metal adapter layer passes through the third insulating layer, the second insulating layer, and the first insulating layer, and is in contact with the first gate layer to connect the first gates and the second gates together.

In some embodiments, one side of the metal adapter layer passes through the third insulating layer and is in contact with the second gate lines of the second gate layer, while another side of the metal adapter layer passes through the third insulating layer, the second insulating layer, and the first insulating layer, and is in contact with the first gate layer to connect the first gates and the second gates together.

The present application further provides a display panel including the array substrate as described above, the array substrate including:

a substrate;

a first gate layer formed on the substrate, and the first gate layer including a plurality of first gates;

a first insulating layer, an active layer, a source/drain layer, and a second insulating layer, sequentially formed over the first gate layer; and a second gate layer formed on the second insulating layer, and the second gate layer including a plurality of second gates, wherein the first gate layer further includes a plurality of first gate lines connecting the plurality of first gates, and at least two of the plurality of second gate are connected to a same one of the plurality of first gates; or the second gate layer further includes a plurality of second gate lines connecting the plurality of second gates, and the at least two of the plurality of first gates are connected to a same one of the plurality of second gates.

In some embodiments, the first gate layer includes a first connection line connecting the plurality of first gates together to form a first gate group, one of the first gates in the first gate group connected to one of the second gates to connect the plurality of first gates to the same one of the plurality of second gates.

In some embodiments, the first connection line at least partially coincides with the second gate line.

In some embodiments, the source/drain layer includes a plurality of data lines, the second gate layer includes a plurality of second gate lines, and the plurality of data lines and the plurality of second gate lines intersect with each other to form a plurality of first pixel units, wherein the first gates of a plurality of sub-pixels in one of the first pixel units are all connected to the second gate of a same one of the sub-pixels.

In some embodiments, the second gate layer includes a second connection line, the second connection line is connected to the plurality of second gates together to form a second gate group, one of the second gates of the second gate group is connected to one of the first gates to connect the plurality of second gates to the same one of the plurality of first gates.

In some embodiments, the second connection line at least partially coincides with the first gate line.

In some embodiments, the source/drain layer include a plurality of data lines, the first gate layer includes a plurality of first gate lines, and the plurality of data lines and the plurality of first gate lines intersect with each other to form a plurality of second pixel units, wherein the second gates of a plurality of sub-pixels in one of the second pixel units are all connected to the first gate of a same one of the sub-pixels.

In some embodiments, the array substrate further includes a third insulating layer formed on the second gate layer; and a metal adapter layer formed on the third insulating layer, wherein one side of the metal adapter layer passes through the third insulating layer and is in contact with the second gate layer, while another side of the metal adapter layer passes through the third insulating layer, the second insulating layer, and the first insulating layer, and is in contact with the first gate layer to connect the first gates and the second gates together.

In some embodiments, one side of the metal adapter layer passes through the third insulating layer and is in contact with the second gate line of the second gate layer, while another side of the metal adapter layer passes through the third insulating layer, the second insulating layer, and the first insulating layer, and is in contact with the first gate layer to connect the first gates and the second gates together.

The array substrate of the present application adopts a double gate structure including a first gate layer and a second gate layer, which effectively improves the carrier mobility of the thin film transistor. Meanwhile, a plurality of first gates of a first gate layer are connected through a first gate line, and then at least two of second gates of a second gate layer are connected to a same one of the first gates of the first gate layer; or, a plurality of second gates of a second gate layer are connected through the second gate line, and then at least two of the first gates of the first gate layer are connected to a same second one of the second gates of the second gate layer. Therefore, it is not necessary to connect the plurality of first gates and the plurality of second gates one by one, thus avoiding providing an adapter hole for connecting the first gate and the second gate in each of the sub-pixels, thereby reducing an area occupied by the adapter hole, such that an object of increasing a storage capacitance of the sub-pixels and reducing a capacitance of the gate lines is realized, and the display device has a better display effect.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

Figure 1:
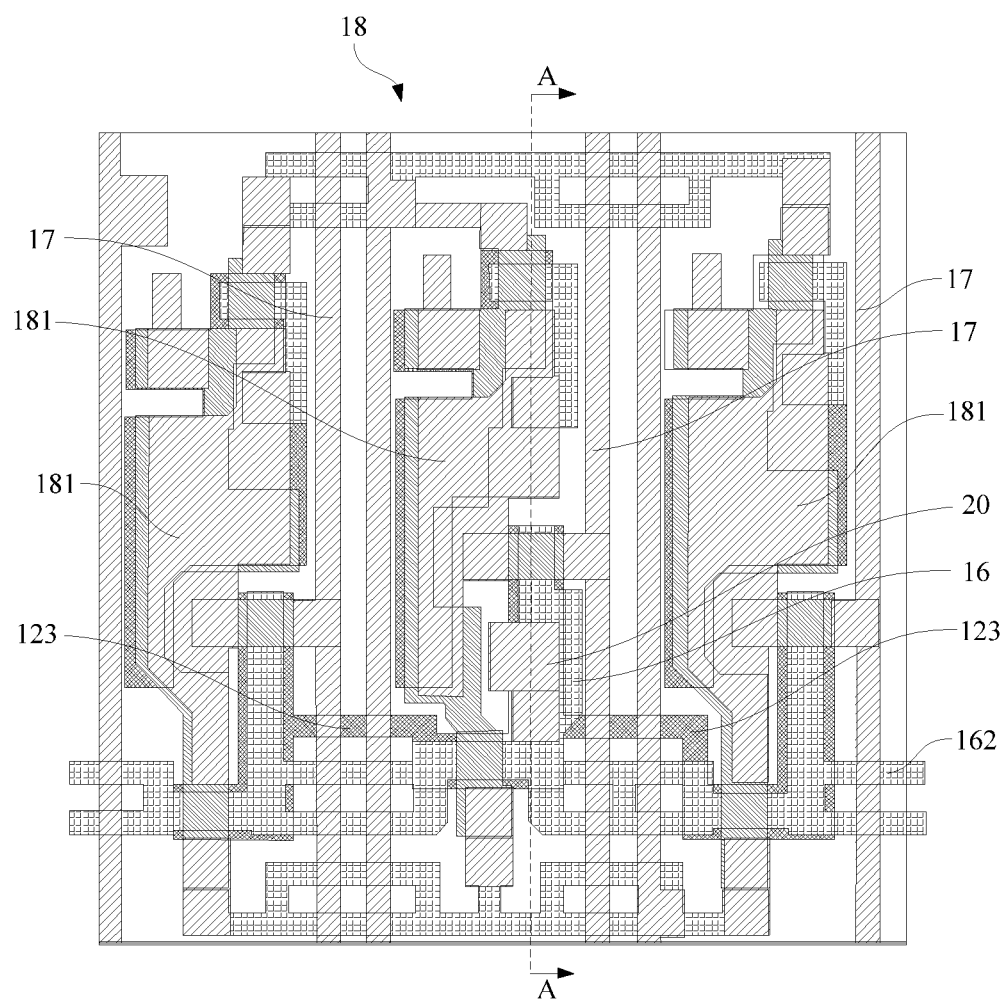
FIG. 1 is a schematic structural diagram of a first pixel unit provided by an embodiment of the present application.

Array substrate 10; substrate 11; first gate layer 12; first gate 121; first connection line 122; first insulating layer 13, active layer 14, second insulating layer 15, second gate layer 16; second gate 161; second gate line 162; data line 17; first pixel unit 18; sub-pixel 181; third insulating layer 19; metal adapter layer 20; and fourth insulating layer 21.

DETAILED DESCRIPTION OF PREFERRED EMBODIMENTS

The technical solutions in the present application are clearly and completely described in the following with reference to the drawings in the present application. It is obvious that the described embodiments are only a part of the embodiments of the present application, and not all of the embodiments. All other embodiments obtained by a person skilled in the art based on the embodiments of the present application without creative efforts are within the scope of the present application.

In the description of the present application, it is to be understood that the orientation or positional relationship of the indications by the terms "center", "longitudinal", "transverse", "length", "width", "thickness", "upper", "lower", "front", "back", "left", "right", "vertical", "horizontal", "top", "bottom", "inside", "outside", etc. is based on the orientation shown in the drawings. The positional relationship is merely for the convenience of the description of the present application and the simplification of the description, and is not intended to indicate or imply that the device or component referred to has a specific orientation, is constructed and operated in a specific orientation, and thus is not to be construed as limiting the present application. Moreover, the terms "first" and "second" are used for descriptive purposes only and are not to be construed as indicating or implying a relative importance or implicitly indicating the number of technical features indicated. Thus, features defining "first" or "second" may include one or more of the described features either explicitly or implicitly. In the description of the present application, the meaning of "a plurality" is two or more unless specifically and specifically defined otherwise.

In the present application, the word "exemplary" is used to mean "serving as an example, instance, or illustration." Any embodiment described in this application as "exemplary" is not necessarily to be construed as preferred or advantageous over other embodiments. To enable any person skilled in the art to make and use the present application, the following description is presented. In the following description, details are set forth for the purpose of explanation. It will be appreciated that those skilled in the art will recognize that the present invention can be practiced without the specific details. In other instances, well-known structures and procedures are not described in detail to avoid unnecessary detail. Therefore, the present application is not intended to be limited to the embodiments shown, but is in accord with the broad scope of the principles and features disclosed herein.

The present application provides an array substrate. The details are described below respectively.

Figure 2:
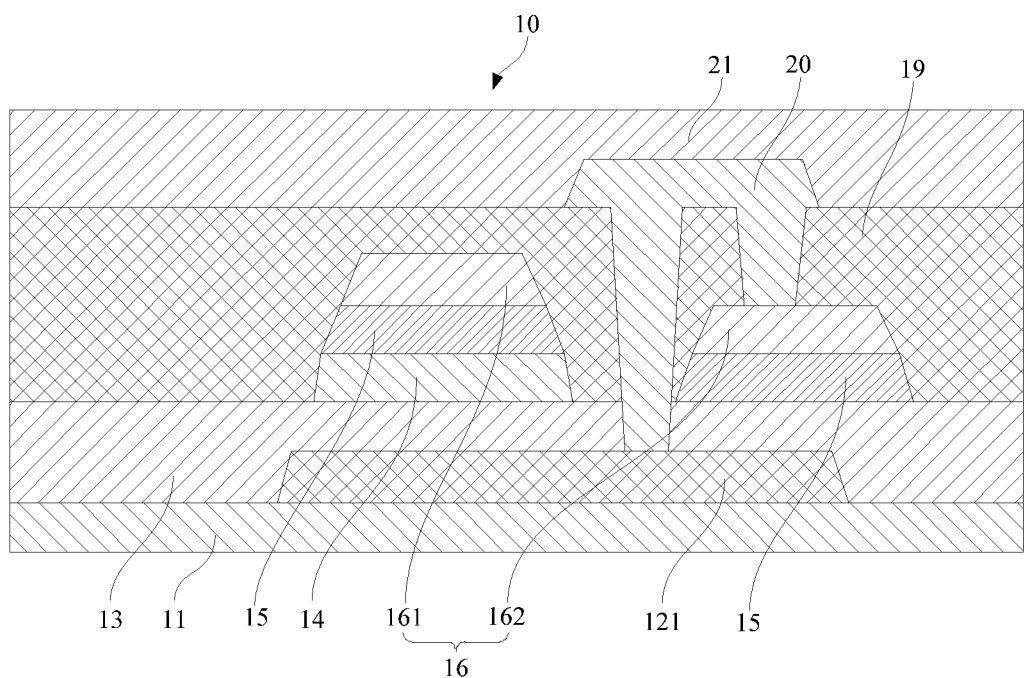
FIG. 2 is a partial cross-sectional view taken along a line A-A of FIG. 1.

Referring to FIGS. 1 and 2, the array substrate 10 includes a substrate 11 as a base, and a first gate layer 12 formed on the substrate 11. The first gate layer 12 includes a plurality of first gates 121. A first insulating layer 13, an active layer 14 and a source/drain layer (not shown) are further sequentially formed on the first gate layer 12. The active layer 14 is made of a semiconductor material that is located above the first gates 121 and is separated from the first gates 121 by the first insulating layer 13. The source/drain layer includes a source and a drain distributing on both sides of the active layer 14 respectively, and at least a portion of the source and at least a portion of the drain are located above the active layer 14 and in contact with the active layer 14.

A second insulating layer 15 is formed on the source/drain layer, and a second gate layer 16 is further formed on the second insulating layer 15. The source/drain layer and the second gate layer 16 are spaced apart from each other by the second insulating layer 15. The second gate layer 16 includes a plurality of second gates 161, and the first gate layer 12 and the second gate layer 16 are connected, so that the plurality of first gates 121 of the first gate layer 12 and the plurality of second gates 161 of the second gate layers 16 are connected to form a thin film transistor having a double gate structure, which effectively improves a carrier mobility of the thin film transistor constituted by the first gates 121, the active layer 14, the source, the drain, and the second gates 161.

In some embodiments, as shown in FIG. 1, the second gate layer 16 may include second gate lines 162 connecting the plurality of second gates 161, and the at least two of the first gates 121 are connected to a same one of the second gates 161, so that the first gate layer 12 and the second gate layer 16 are connected, and it is not necessary to connect the plurality of first gates 121 and the plurality of second gates 161 one by one, thus avoiding providing an adapter hole for connecting the first gate and the second gate in each of the sub-pixels, thereby reducing an area occupied by the adapter hole, such that an object of increasing a storage capacitance of the sub-pixels and reducing a capacitance of the gate lines is realized, and the display device has a better display effect.

The first gate layer 12 may include a first connection line 122 that connects the plurality of first gates 121 together to form a first gate group, and one of the first gates 121 of the first gate group is connected to one of the second gates 161, such that the plurality of first gates 121 are connected to a same one of the second gates 161. The first gates 121 in the first gate group may be directly connected to the second gate 161 or the second gate lines 162, or the first connection line 122 of the first gate group may be connected to the second gates 161.

It should be noted that a number of the first gates 121 included in the first gate group may be determined according to a number of the first gates 121 connected to the same one of the second gates electrode 161. For example, when two of the first gates 121 of the first gate layer 12 are connected to a same one of the second gates 161 of the second gate layer 16, the first connection line 122 connects the two of the first gates 121 together to form the first gate group; and when three of the first gates 121 of the first gate layer 12 are connected to a same one of the second gates 161 of the second gate layer 16, the first connection line 122 connects the three of the first gates 121 together to form the first gate group.

In some embodiments, the first connection line 122 and the second gate line 162 may at least partially coincide with each other to save wiring space inside pixels, and reduce light shielding by the first connection line 122, thereby improving transmittance of the thin film transistor.

It should be noted that the first connection line 122 may partially coincide with the second gate line 162, or the first connection line 122 may entirely coincide with the second gate line 162. Of course, the latter has a better effect on improving the transmittance of the thin film transistor. When the first connection line 122 entirely coincide with the second gate line 162, a width of the first connection line 122 may be less than or equal to a width of the second gate line 162.

As shown in FIG. 1, the source/drain layer includes a plurality of data lines 17 that connect the plurality of sources of the source/drain layer together. In addition, the second gate layer 16 includes a plurality of second gate lines 162. The plurality of data lines 17 of the source/drain layer and the plurality of second gate lines 162 intersect with each other to form a plurality of first pixel units 18. The first pixel units 18 include a plurality of sub-pixels 181.

In some embodiments, the first gates 121 of the plurality of sub-pixels 181 in the first pixel units 18 may be all connected to the second gate 161 of a same one of the sub-pixels 181.

It can be understood that as the number of the first gate 121 connected to the second gates 161 is increased, a number of the adapter holes is decreased, and the storage capacitance of the plurality of sub-pixels 181 of the first pixel units 18 is increased. However, the longer the length of the first connection line 122, the more the data lines 17 overlaps with the first connection line 122, which tends to increase a risk of short circuit during preparing the array substrate 10. In the present application, the first gates 121 of the plurality of sub-pixels 181 in the first pixel units 18 are connected to the second gate 161 of a same one of the sub-pixels 181, so that the length of the first connection line 122 is moderate, and the storage capacitor of the sub-pixels 181 is effectively improved, while the risk of short circuit during preparing the array substrate 10 is reduced.

In addition, when the first gates 121 of the plurality of first pixel units 18 are connected to one of the first pixel units 18, some of the first pixel units 18 may have an adapter hole, while some of the first pixel units 18 do not have an adapter hole, so that there is a large difference between the first pixel units 18. In the present application, by connecting the first gates 121 of the plurality of sub-pixels 181 in the first pixel units 18 to the second gates 161 of a same one of the sub-pixels 181, the difference between the first pixel units 18 can be reduced, and the display effect of the display device is improved.

In some embodiments, each of the first pixel unit 18 may include three sub-pixels 181 sequentially distributed, and the first gates 121 of the three sub-pixels 181 in each of the first pixel unit 18 may be all connected to the second gate 161 of the sub-pixel 181 in the middle.

Specifically, as shown in FIG. 1, the three sub-pixels 181 of the first pixel unit 18 are arranged side by side in a horizontal direction, and colors of the three sub-pixels 181 are red, green, and blue, respectively. The first gates 121 of the three sub-pixels 181 are all connected to the second gate 161 of the green sub-pixel 181.

Of course, the first gates 121 of the three sub-pixels 181 in the first pixel unit 18 may alternatively be all connected to the second gate 161 of the sub-pixel 181 at the end.

Table 1 below shows a storage capacitance and gate line capacitance of each of the sub-pixels measured experimentally when the plurality of first gates and the plurality of second gates of the array substrate are connected to each other one by one.

TABLE 1

| Items | C(pF) |
|---|---|
| Cst-R | 0.241 |
| Cst-G | 0.238 |
| Cst-B | 0.247 |
| Gate | 0.424 |

Table 2 below shows a storage capacitance and gate line capacitance of each of the sub-pixels measured experimentally when the three first gates 121 are connected to one of the second gates 161 in the first pixel unit 18 of the array substrate 10.

TABLE 2

| Items | C(pF) |
|---|---|
| Cst-R | 0.323 |
| Cst-G | 0.227 |
| Cst-B | 0.328 |
| Gate | 0.379 |

Here, Cst_R represents the storage capacitance (Cst) of the red sub-pixel 181; Cst_G represents the storage capacitance (Cst) of the green sub-pixel 181; Cst_B represents the storage capacitance (Cst) of the blue sub-pixel 181; and Gate represents the gate line capacitance.

As can be seen from the comparison between Table 1 and Table 2, the array substrate 10 of the present application can effectively increase the storage capacitance of each of the sub-pixels 181 of the first pixel unit 18 and reduce the gate line capacitance.

In other embodiments, the first gate layer 12 may further include first gate lines connecting the plurality of first gates 121, and at least two of the second gates 161 of the second gate layer 16 are connected to a same one of the first gates 121 of the gate layer 12, so that the plurality of first gates 121 of the first gate layer 12 and the plurality of second gates 161 of the second gate layer 16 are maintained in connection with each other, and it is not necessary to connect the plurality of first gates 121 and the plurality of second gates 161 one by one, thus avoiding providing an adapter hole for connecting the first gate and the second gate in each of the sub-pixels, thereby reducing an area occupied by the adapter hole, such that an object of increasing a storage capacitance of the sub-pixels and reducing a capacitance of the gate lines is realized, and the display device has a better display effect.

In some embodiments, the second gate layer 16 may include a second connection line connecting the plurality of second gates 161 together to form a second gate group. In the second gate group, one second gate 161 is connected to one of the first gate 121 in a same gate layer 12, to connect the plurality of second gates 161 of the second gate layer 16 to one of the first gate 121 in the same gate layer 12. The second gates 161 of the second gate group may be connected to the first gate 121 or the first gate line, or the second connection line of the second gate group may be maintained in connection with the first gate 121 or the first gate line.

It should be noted that a number of the second gates 161 included in the second gate group may be determined according to a number of the second gates 161 connected to a same one of the first gates 121, and details are not repeated herein for brevity.

In some embodiments, the second connection line and the first gate line may at least partially coincide with each other to reduce light shielding by the second connection line and improve the transmittance of the thin film transistor. Alternatively, the second connection line may partially coincide with the first gate line, or the second connection line may entirely coincide with the first gate line 162. Of course, the latter has a better effect on improving the transmittance of the thin film transistor. When the second connection line entirely coincide with the first gate line, a width of the second connection line may be less than or equal to a width of the first gate line.

In some embodiments, the first gate layer 12 may include a plurality of first gate lines, and the plurality of first gate lines intersect with a plurality of data lines 17 of a source/drain layer to form a plurality of second pixel units. The second pixel units include a plurality of sub-pixels. The second gates 161 of the plurality of sub-pixels in each of the second pixel units can be connected to the first gate 121 of a same one of the sub-pixels, to effectively increase the storage capacitance of the sub-pixels and reduce the short circuit during preparing the array substrate 10, so that the difference between the second pixel units can be reduced, and the display effect of the display device is improved.

Optionally, each of the second pixel unit may include three sub-pixels sequentially distributed, and the second gates 161 of the three sub-pixels 181 in each of the second pixel unit may be all connected to the first gate 121 of the sub-pixel in the middle.

Specifically, the three sub-pixels of the second pixel unit are arranged side by side in a horizontal direction, and colors of the three sub-pixels are red, green, and blue, respectively. The second gates 161 of the three sub-pixels are all connected to the first gate of the green sub-pixel 181.

Of course, the second gates 161 of the three sub-pixels 181 in the second pixel unit may alternatively be all connected to the first gate 121 of the sub-pixel at the end.

In some embodiments, as shown in FIG. 2, the array substrate 10 may further include a third insulating layer 19 formed on the second gate layer 16, and a metal adapter layer 20 formed on the third insulating layer 19. The metal adapter layer 20 connects the first gate layer 12 and the second gate layer 16 together through a lower adapter hole, so that the plurality of first gates 121 of the first gate layer 12 are connected the second gate layer 16, or the plurality of second gates 161 of the second gate layer 16 are connected to the first gate layer 12.

Specifically, the second gate layer 16 includes a second gate line 162 connecting the plurality of second gates 161, and one side of the metal adapter layer 20 passes through the third insulating layer 19 to be in contact with the second gate layer 16, while another side of the metal adapter layer 20 passes through the third insulating layer 19, the second insulating layer 15, and the first insulating layer 13 to be in contact with the first gate layer 12, to connect the first gates 121 and the second gates 161 together.

In other embodiments, the first gate layer 12 may also include the first gates 121 and the first gate lines, and one side of the metal adapter layer 20 passes through the third insulating layer 19 to be in contact with the second gate layer 16, while another side of the metal adapter layer 20 passes through the third insulating layer 19, the second insulating layer 15, and the first insulating layer 13 to be in contact with the first gates of the first gate layer 12, to connect the first gates 121 and the second gates 161 together.

Of course, the second gate layer 16 may directly pass through the second insulating layer 15 and the first insulating layer 13 to be in contact with the first gate layer 12 to realize a connection of the second gates 161 of the second gate layer 16 to the first gates 121 of the first gate layer 12.

In some embodiments, as shown in FIG. 2, a fourth insulating layer 21 may also be formed on the third insulating layer 19 and the metal adapter layer 20 to protect the metal adapter layer 20.

In addition, the array substrate 10 may further include a planarization layer, a pixel electrode layer, and the like, which are not shown in FIG. 2, and will not be described herein.

The present application also provides a display panel, which includes an array substrate. The specific structure of the array substrate can refer to the above embodiments. Since the display panel adopts all the technical solutions of all the above embodiments, it processes at least the benefits brought by the technology of the above embodiments, which will not be repeated herein for brevity.

The display panel can be any display panel having the above array substrate, such as a flexible display panel, a micro light emitting diode display panel, an organic light emitting diode display panel, and the like, which is not particularly limited herein.

In the above-mentioned embodiments, the descriptions of the various embodiments are different, and the detailed description of the other embodiments is omitted, and details are not repeated herein for brevity.

In the specific implementation, the foregoing various units or structures may be implemented as a separate entity, or may be implemented in any combination, as the same or several entities. For the specific implementation of the above various units or structures, one can refer to the foregoing method embodiments, and details are not repeated herein for brevity.

For the specific implementation of the foregoing operations, one can refer to the foregoing embodiments, and details are not repeated herein for brevity.

Detailed descriptions of a foldable display device provided by the present application have been provides. The principles and implementations of the present application are described in the specific examples. The description of the above embodiments is only used to help understand the method of the present application. Meanwhile, those skilled in the art will have any changes in the specific embodiments and application scope according to the idea of the present application. In summary, the content of this specification should not be construed as limiting the present application.

What is claimed is:

1. An array substrate, comprising:
a substrate;
a first gate layer formed on the substrate, and the first gate layer comprising a first connection line and a plurality of first gates, the first connection line connecting the plurality of first gates together to form a first gate group;
a first insulating layer, an active layer, a source/drain layer, and a second insulating layer, sequentially formed over the first gate layer;
a second gate layer formed on the second insulating layer, and the second gate layer comprising a plurality of second gates and a second gate line connecting the plurality of second gates;
a third insulating layer formed on the second gate layer; and
a metal adapter layer formed on the third insulating layer, one side of the metal adapter layer passing through the third insulating layer and in contact with the second gate layer, while another side of the metal adapter layer passing through the third insulating layer, the second insulating layer, and the first insulating layer, and in contact with the plurality of first gates in the first gate group to connect the plurality of first gates in the first gate group to a same one of the plurality of second gates, wherein an orthographic projection of the metal adapter layer on the substrate is offset from an orthographic projection of the active layer on the substrate.

2. The array substrate of claim 1, wherein the first connection line at least partially coincides with the second gate line.

3. An array substrate, comprising:
a substrate;
a first gate layer formed on the substrate, and the first gate layer comprising a plurality of first gates;
a first insulating layer, an active layer, a source/drain layer, and a second insulating layer, sequentially formed over the first gate layer;
a second gate layer formed on the second insulating layer, and the second gate layer comprising a plurality of second gates, and
a third insulating layer formed on the second gate layer; and a metal adapter layer formed on the third insulating layer, wherein one side of the metal adapter layer passes through the third insulating layer and is in contact with the second gate layer, while another side of the metal adapter layer passes through the third insulating layer, the second insulating layer, and the first insulating layer, and is in contact with the first gate layer to connect the first gates and the second gates together, wherein an orthographic projection of the metal adapter layer on the substrate is offset from an orthographic projection of the active layer on the substrate;
wherein the first gate layer further comprises a plurality of first gate lines connecting the plurality of first gates, and at least two of the plurality of second gate are connected to a same one of the plurality of first gates; or the second gate layer further comprises a plurality of second gate lines connecting the plurality of second gates, and the at least two of the plurality of first gates are connected to a same one of the plurality of second gates.

4. The array substrate of claim 3, wherein the first gate layer comprises a first connection line connecting the plurality of first gates together to form a first gate group, one of the first gates in the first gate group connected to one of the second gates to connect the plurality of first gates to the same one of the plurality of second gates.

5. The array substrate of claim 4, wherein the first connection line at least partially coincides with the second gate line.

6. The array substrate of claim 4, wherein the source/drain layer comprises a plurality of data lines, the second gate layer comprises a plurality of second gate lines, and the plurality of data lines and the plurality of second gate lines intersect with each other to form a plurality of first pixel coincides, wherein the first gates of a plurality of sub-pixels in one of the first pixel coincides are all connected to the second gates of a same one of the sub-pixels.

7. The array substrate of claim 3, wherein the second gate layer comprises a second connection line, the second connection line is connected to the plurality of second gates together to form a second gate group, one of the second gates of the second gate group is connected to one of the first gates to connect the plurality of second gates to the same one of the plurality of first gates.

8. The array substrate of claim 7, wherein the second connection line at least partially coincides with the first gate line.

9. The array substrate of claim 7, wherein the source/drain layer comprise a plurality of data lines, the first gate layer comprises a plurality of first gate lines, and the plurality of data lines and the plurality of first gate lines intersect with each other to form a plurality of second pixel coincides, wherein the second gates of a plurality of sub-pixels in one of the second pixel coincides are all connected to the first gates of a same one of the sub-pixels.

10. The array substrate of claim 3, wherein one side of the metal adapter layer passes through the third insulating layer and is in contact with the second gate line of the second gate layer, while another side of the metal adapter layer passes through the third insulating layer, the second insulating layer, and the first insulating layer, and is in contact with the first gate layer to connect the first gates and the second gates together.

11. A display panel, comprising an array substrate, the array substrate comprising:
a substrate;
a first gate layer formed on the substrate, and the first gate layer comprising a plurality of first gates;
a first insulating layer, an active layer, a source/drain layer, and a second insulating layer, sequentially formed over the first gate layer;
a second gate layer formed on the second insulating layer, and the second gate layer comprising a plurality of second gates, and
a third insulating layer formed on the second gate layer; and a metal adapter layer formed on the third insulating layer, wherein one side of the metal adapter layer passes through the third insulating layer and is in contact with the second gate layer, while another side of the metal adapter layer passes through the third insulating layer, the second insulating layer, and the first insulating layer, and is in contact with the first gate layer to connect the first gates and the second gates together, wherein an orthographic projection of the metal adapter layer on the substrate is offset from an orthographic projection of the active layer on the substrate;
wherein the first gate layer further comprises a plurality of first gate lines connecting the plurality of first gates, and at least two of the plurality of second gate are connected to a same one of the plurality of first gates; or the second gate layer further comprises a plurality of second gate lines connecting the plurality of second gates, and the at least two of the plurality of first gates are connected to a same one of the plurality of second gates.

12. The display panel of claim 11, wherein the first gate layer comprises a first connection line connecting the plurality of first gates together to form a first gate group, one of the first gates in the first gate group connected to one of the second gates to connect the plurality of first gates to the same one of the plurality of second gates.

13. The display panel of claim 12, wherein the first connection line at least partially coincides with the second gate line.

14. The display panel of claim 12, wherein the source/drain layer comprises a plurality of data lines, the second gate layer comprises a plurality of second gate lines, and the plurality of data lines and the plurality of second gate lines intersect with each other to form a plurality of first pixel coincides, wherein the first gates of a plurality of sub-pixels in one of the first pixel coincides are all connected to the second gates of a same one of the sub-pixels.

15. The display panel of claim 11, wherein the second gate layer comprises a second connection line, the second connection line is connected to the plurality of second gates together to form a second gate group, one of the second gates of the second gate group is connected to one of the first gates to connect the plurality of second gates to the same one of the plurality of first gates.

16. The display panel of claim 15, wherein the second connection line at least partially coincides with the first gate line.

17. The display panel of claim 15, wherein the source/drain layer comprise a plurality of data lines, the first gate layer comprises a plurality of first gate lines, and the plurality of data lines and the plurality of first gate lines intersect with each other to form a plurality of second pixel coincides, wherein the second gates of a plurality of sub-pixels in one of the second pixel coincides are all connected to the first gates of a same one of the sub-pixels.

18. The display panel of claim 11, wherein one side of the metal adapter layer passes through the third insulating layer and is in contact with the second gate line of the second gate layer, while another side of the metal adapter layer passes through the third insulating layer, the second insulating layer, and the first insulating layer, and is in contact with the first gate layer to connect the first gates and the second gates together.

* * * * *